United States Patent
Acharya (10) Patent No.: US 7,880,526 B2
(45) Date of Patent: Feb. 1, 2011

(54) LEVEL SHIFTER, STANDARD CELL, SYSTEM AND METHOD FOR LEVEL SHIFTING

(75) Inventor: Pramod Acharya, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/189,202

(22) Filed: Aug. 11, 2008

(65) Prior Publication Data

US 2010/0033224 A1 Feb. 11, 2010

(51) Int. Cl.
*H03L 5/00* (2006.01)
(52) U.S. Cl. .............................. 327/333; 326/63; 326/81
(58) Field of Classification Search ............. 326/62–63, 326/80–81; 327/306, 333
See application file for complete search history.

(56) References Cited

U.S. PATENT DOCUMENTS

| 4,731,342 | A | * | 3/1988 | Ishiuchi ...................... 438/243 |
| 7,119,578 | B2 | | 10/2006 | Correale, Jr., et al. |
| 7,199,617 | B1 | * | 4/2007 | Schrom et al. ................. 326/86 |
| 2005/0285658 | A1 | * | 12/2005 | Schulmeyer et al. ........ 327/333 |
| 2007/0170465 | A1 | | 7/2007 | Kwon et al. |

OTHER PUBLICATIONS

Rajesh Garg; Gagandeep Mallarapu; Sunil P. Khatri, A Single-supply True Voltage Level Shifter; EDAA; 2008; 978-3-9810801-3-1/DATE08

* cited by examiner

*Primary Examiner*—Dinh T. Le
(74) *Attorney, Agent, or Firm*—SpryIP, LLC (57) ABSTRACT

Implementations are presented herein that include a level shifter circuit.

14 Claims, 7 Drawing Sheets

LEVEL SHIFTER, STANDARD CELL, SYSTEM AND METHOD FOR LEVEL SHIFTING

BACKGROUND

Many semiconductor integrated circuits contain blocks that operate at different supply voltage levels. A CMOS circuit may include blocks that operate at different supply voltage levels in order to reduce power consumption. In CMOS technology, both the dynamic and the leakage power consumption depend upon the supply voltage, and they decrease quadratically with decreasing supply voltage. The supply voltage may be decreased in non-critical parts of an integrated circuit. Furthermore, the supply voltage may be regulated dynamically according to current performance requirements. As a consequence, many voltage domains may be formed on a single integrated circuit.

When a signal traverses on-chip voltage domains, a level shifter is required. The level shifter may serve as an interface between different blocks to shift a voltage level of a signal of one block to an appropriate voltage level of another block. Level shifters that are required to interface different voltage domains should be able to efficiently convert any voltage level to any other desired voltage level.

BRIEF DESCRIPTION OF THE DRAWINGS

The detailed description is described with reference to the accompanying figures. In the figures, the left-most digit of a reference number identifies the figure in which the reference number first appears. The use of the same reference numbers in different instances in the description and the figures may indicate similar or identical items.

DETAILED DESCRIPTION

At least one implementation described herein relates to a level shifter circuit that is formed in one well. The level shifter circuit includes an input node, an internal node and a capacitor that has at least two terminals. At least a first terminal of the at least two terminals is coupled to the input node and at least a second terminal of the at least two terminals is coupled to the internal node.

Another implementation described herein relates to a method for level shifting in a level shifter circuit that is formed in one well. The method includes receiving an input signal and providing a voltage level of the input signal to a boosted node. The method further includes providing an output signal in response to a voltage level of the boosted node.

Exemplary Arrangements

Figure 1:
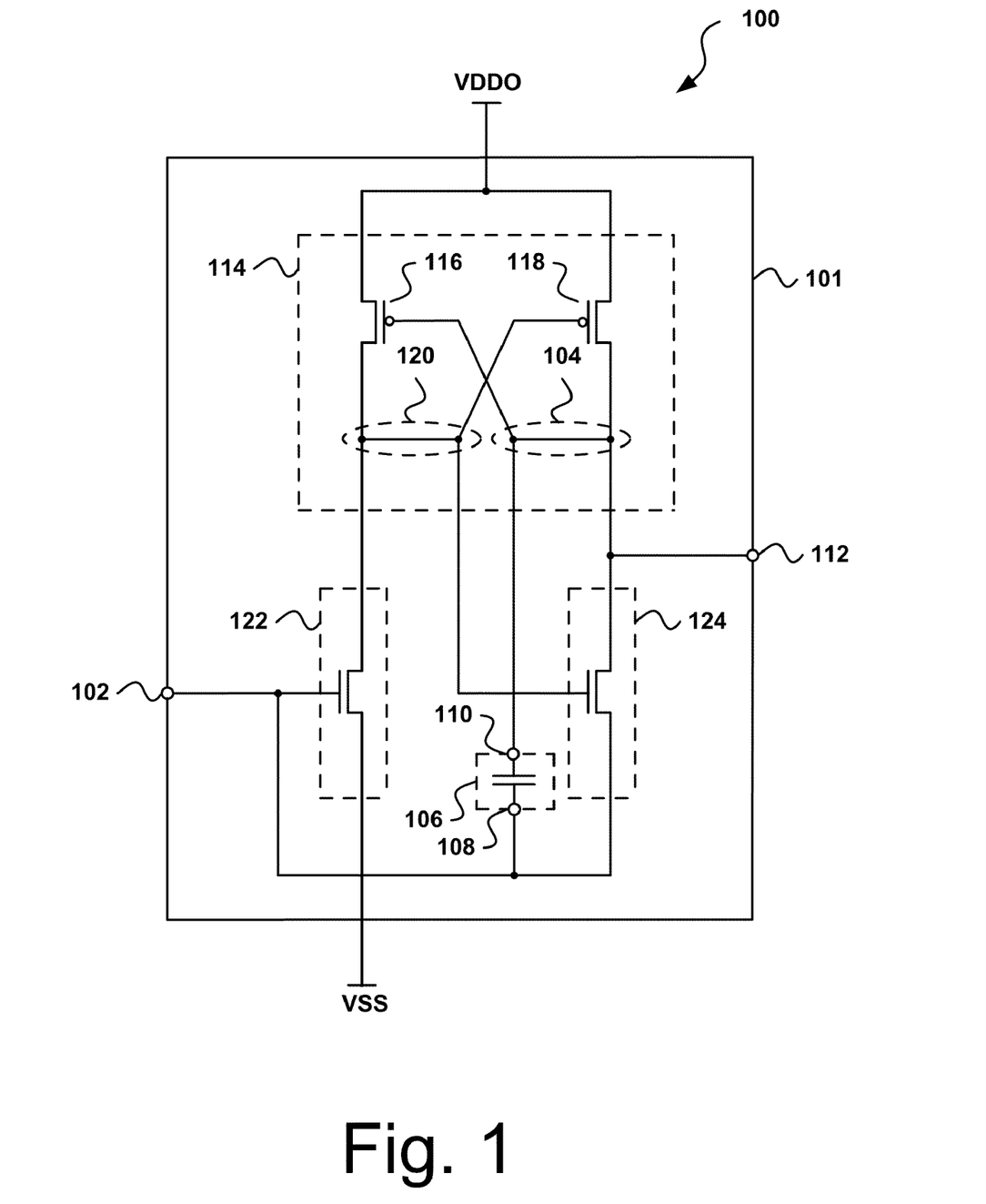
FIG. 1 illustrates an exemplary level shifter circuit having an input node, an internal node and a capacitor.

FIG. 1 illustrates an exemplary level shifter circuit 100 having an input node 102, an internal node 104 and a capacitor 106. A first terminal 108 of the capacitor 106 is coupled to the input node 102, and a second terminal 110 of the capacitor 106 is coupled to the internal node 104.

The level shifter circuit 100 may receive an input signal at the input node 102, and the input signal may have low and high voltage states. Generally, the level shifter circuit 100 may shift a voltage level of the input signal from a first voltage to a second voltage. The level shifter circuit 100 may shift the voltage level of the input signal from a high to a low voltage, or from a low to a high voltage. That is, the level shifter circuit 100 may handle a low to high, or a high to low voltage conversion. More specifically, a voltage level of the high voltage state of the input signal may correspond to a first supply voltage VDDI (not shown in FIG. 1). The level shifter circuit 100 may provide an output signal at an output node 112, and the output signal may have low and high voltage states. A voltage level of the high voltage state of the output signal may correspond to a second supply voltage VDDO. A voltage level of the high voltage state of the output signal may be different than the voltage level of the high voltage state of the input signal, e.g., the first supply voltage VDDI may be different than the second supply voltage VDDO.

The level shifter circuit 100 is formed in one semiconductor well 101. For example, the level shifter circuit 100 may be formed in a single n-well of a semiconductor substrate. The integration of the level shifter circuit 100 in a single well may allow for an area-efficient implementation, and an area-overhead, which is caused by a well to well spacing or by an additional ESD protection device, may be avoided.

The level shifter circuit 100 is supplied by the supply voltage VDDO that corresponds to the voltage level of the high voltage state of the output signal. The level shifter circuit 100 does not need to receive the supply voltage VDDI that corresponds to the voltage level of the high voltage state of the input signal. Only a single supply voltage VDDO is required for the voltage level conversion in the level shifter circuit 100.

In an integrated circuit, a level shifter circuit 100 may be placed close to or within a VDDO voltage domain that may be separated by a large distance from a VDDI voltage domain. No supply voltage wire of the supply voltage VDDI needs to be routed to the level shifter circuit 100, e.g., no supply voltage wire needs to be routed from the VDDI voltage domain to the VDDO voltage domain. Therefore, in a multi voltage system, routing congestions may be avoided. Further, a flexible placement of modules may be allowed in an integrated circuit, thus enabling an efficient physical design of the integrated circuit.

The capacitor 106 may be a bootstrapping capacitor that provides a voltage level at the input node 102 to the internal node 104. After the input signal received at the input node 102 has switched from a low voltage state to a high voltage state, or vice versa, the bootstrapping capacitor 106 provides the voltage level of the input signal to the internal node 104.

The level shifter circuit 100 may include a latch circuit 114. The latch circuit 114 may be formed by two cross-coupled transistors 116 and 118 that both may be implemented as P-type MOS (PMOS) transistors. The latch circuit 114 may be coupled to the input node 102 to receive the input signal. It may provide a non-inverted signal at a non-inverted terminal 104 and an inverted signal at an inverted terminal 120 in response to a logic state of the input signal. The non-inverted terminal 104 corresponds to the internal node 104. A non-inverted logic state of the input signal may be latched in the non-inverted terminal 104 and an inverted logic state of the input signal may be latched in the inverted terminal 120. The output node 112 may be coupled to the non-inverted terminal and the internal node 104, respectively.

A source terminal of the PMOS transistor 116 may be coupled to a source terminal of the PMOS transistor 118 and to the supply voltage VDDO. A gate terminal of the PMOS transistor 116 may be coupled to a drain terminal of the PMOS transistor 118 and to the second terminal 110 of the capacitor 106 to define the non-inverted terminal and the internal node 104, respectively. A gate terminal of the PMOS transistor 118 may be coupled to a drain terminal of the PMOS transistor 116 to define the inverted terminal 120.

The level shifter circuit 100 may include a first switch device 122 that provides a reference potential VSS to the inverted terminal 120 of the latch circuit 114 in response to the logic state of the input signal received at the input node 102. The reference potential VSS may correspond to the voltage level of the low voltage state of the output signal provided at the output node 112. The first switch device 122 may be implemented as an N-type MOS (NMOS) transistor. A source terminal of the NMOS transistor 122 may be coupled to the reference potential VSS, a drain terminal of the NMOS transistor 122 may be coupled to the inverted terminal 120, and a gate terminal of the NMOS transistor 122 may be coupled to the input node 102.

The level shifter circuit 100 may include a second switch device 124 that provides the voltage level received at the input node 102 to the non-inverted terminal 104 of the latch circuit 114 in response to a logic state of the inverted terminal 120. The second switch device 124 may be implemented as an NMOS transistor. A source terminal of the NMOS transistor 124 may be coupled to the input node 102, a drain terminal of the NMOS transistor 124 may be coupled to the non-inverted terminal 104, and a gate terminal of the NMOS transistor 124 may be coupled to the inverted terminal 120.

During operation, in a first case, the input signal received at the input node 102 may switch from a logic '0' value to a logic '1' value, i.e. it may switch from a low voltage state to a high voltage state. In this case, the NMOS transistor 122 is turned on, thereby passing the reference potential VSS to the inverted terminal 120 of the latch circuit 114. The reference potential VSS at the inverted terminal 120 corresponds to a logic '0' value. The NMOS transistor 124 is turned off by the logic '0' value at the inverted terminal 120. As the source terminal of the NMOS 122 is coupled to the logic '1' value of the input node 102, the NMOS transistor 122 may be turned off quickly. The PMOS transistor 118 is turned on by the logic '0' value at the inverted terminal 120. Since the PMOS transistor 118 is conducting, the non-inverted terminal 104 of the latch circuit 114 is coupled to the supply voltage VDDO. The supply voltage VDDO at the non-inverted terminal 104 corresponds to a logic '1' value. The high voltage state at the non-inverted terminal 104 turns off the PMOS transistor 116. As the output node 112 is coupled to the non-inverted terminal 104, an output signal is provided at the output node 112 having a high voltage state that corresponds to the supply voltage VDDO.

During operation, in a second case, the input signal received at the input node 102 may switch from a logic '1' value to a logic '0' value, that is it may switch from a high voltage state to a low voltage state. In this case, the NMOS transistor 122 is turned off. Since the first terminal 108 of the capacitor 106 is coupled to the input node 102 and the second terminal 110 of the capacitor 106 is coupled to the non-inverted terminal 104, the capacitor 106 bootstraps the non-inverted terminal 104 to the low voltage state. The low voltage state at the non-inverted terminal 104 turns on the PMOS transistor 116. Since the PMOS transistor 116 is conducting, the inverted terminal 120 is coupled to the supply voltage VDDO, thereby turning on the NMOS transistor 124. With the NMOS transistor 124 turned on, the reference potential VSS is passed to the non-inverted terminal 104. The reference potential VSS at the non-inverted terminal 104 corresponds to a logic '0' value. As the output node 112 is coupled to the non-inverted terminal 104, an output signal is provided at the output node 112 having a low voltage state that corresponds to the reference potential VSS.

In the first case, the bootstrapping capacitor 106 supports a switch of the latch circuit 114 by allowing for a fast switch of the state of the non-inverted terminal 104 from a logic '1' value to a logic '0' value. In the second case, the bootstrapping capacitor 106 effects the switch of the state of the non-inverted terminal 104 and as a consequence, also the switch of the state of the inverted terminal 120.

To summarize, the level shifter circuit 100 may receive an input signal from the VDDI voltage domain and may provide an output signal to a VDDO voltage domain. The voltage level of the high voltage state of the input signal may correspond to the supply voltage VDDI that is different than the voltage level of the high voltage state of the output signal that may correspond to the supply voltage VDDO. In particular, the level shifter circuit 100 may receive the input signal having a logic '1' value that corresponds to the supply voltage VDDI and may provide the output signal having a logic '1' value that corresponds to the supply voltage VDDO. The voltage level of the low voltage state of the input signal may correspond to the voltage level of the low voltage state of the output signal, and both may correspond to the reference potential VSS.

The capacitor 106 may be implemented in any suitable fashion. For example, it may be implemented as a MOS transistor configured as a capacitor, as a metal capacitor, as a polysilicon capacitor, or as a p-well or n-well capacitor.

In one implementation, the latch circuit 114 may be implemented using NMOS transistors, or the switch devices 122, 124 may be implemented using PMOS transistors. In other implementations, the source terminal of the NMOS transistor 124 may be coupled to the reference potential VSS. In yet other implementations, the output node 112 may be coupled to the inverted terminal 120.

Figure 2:
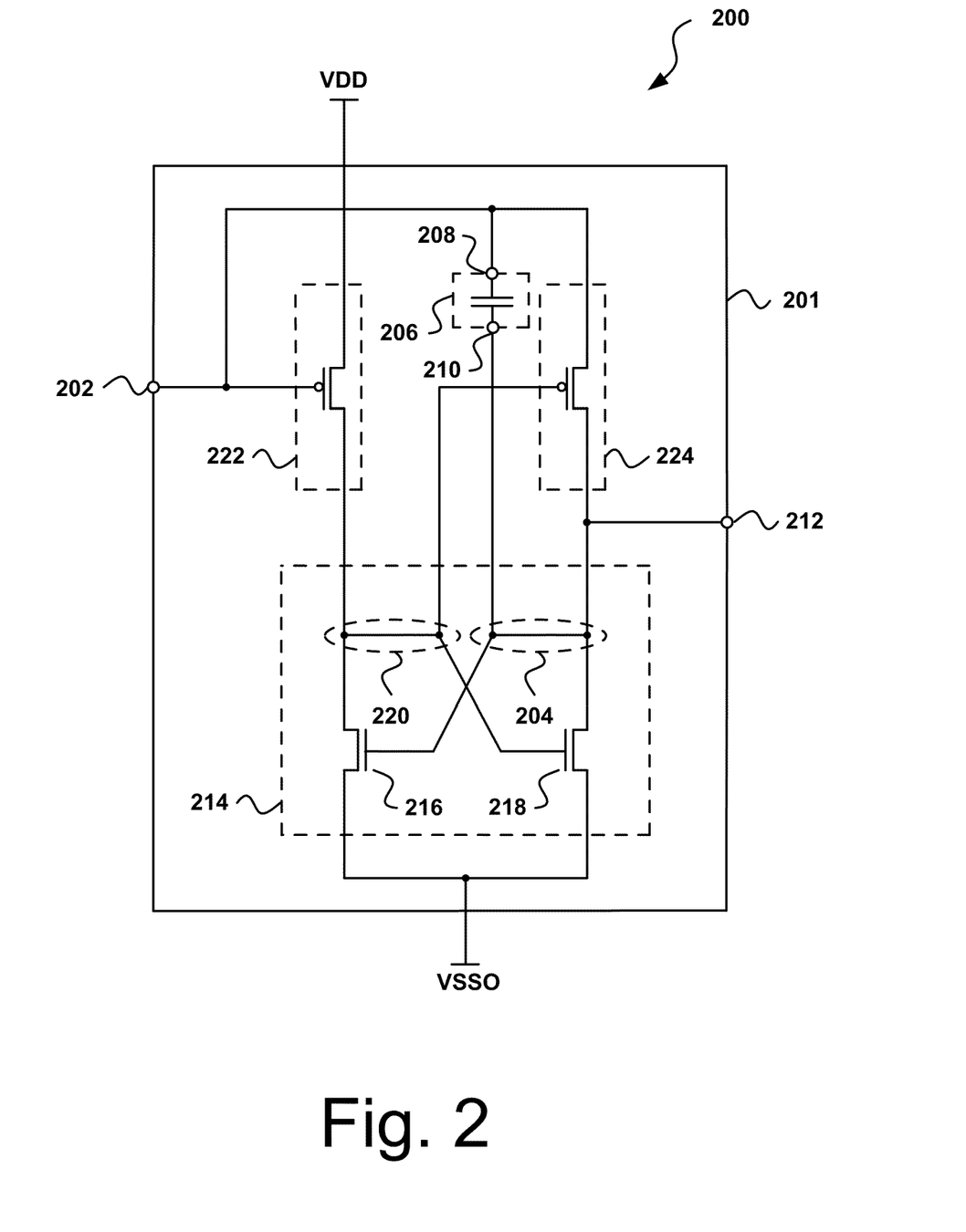
FIG. 2 illustrates a further exemplary level shifter circuit that is implemented in a single well and that includes an input node, an internal node and a capacitor.

FIG. 2 illustrates a further exemplary level shifter circuit 200 that is implemented in a single well 201 and that includes an input node 202, an internal node 204 and a capacitor 206. The level shifter circuit 200 includes a first switch device 222, a second switch device 224 and a latch circuit 214 that includes an inverted terminal 220 and a non-inverted terminal 204. The non-inverted terminal 204 corresponds to the internal node 204.

In contrast to the level shifter circuit 100 illustrated and described in connection with FIG. 1, a voltage level of a low voltage state of the input signal may correspond to a first reference potential VSSI (not shown in FIG. 2) and a voltage level of a low voltage state of the output signal may correspond to a second reference potential VSSO. The first reference potential VSSI may be different than the second reference potential VSSO. A voltage level of a high voltage state of the input signal and a voltage level of a high voltage state of the output signal may both correspond to a same supply voltage VDD.

Similar as described for the first supply voltage VDDI in connection with FIG. 1, the level shifter circuit 200 does not need to receive the first reference potential VSSI; only a single reference potential VSSO is required for the voltage level conversion in the level shifter circuit 200.

As illustrated and described in connection with FIG. 1, the capacitor 206 may be a bootstrapping capacitor that provides a voltage level at the input node 202 to the internal node 204.

The latch circuit 214 may formed by two cross-coupled NMOS transistors 216 and 218, and the first switch device 222 and the second switch device 224 may be implemented as PMOS transistors 222 and 224.

During operation, in one implementation, the input signal received at the input node 202 may switch from a low voltage state to a high voltage state, e. g., it may switch from a logic '0' value to a logic '1' value. In this case, the PMOS transistor 222 is turned off. Since a first terminal 208 of the capacitor 206 is coupled to the input node 202 and a second terminal 210 of the capacitor 206 is coupled to the non-inverted terminal 204, the capacitor 206 bootstraps the non-inverted terminal 204 to the high voltage state. The high voltage state at the non-inverted terminal 204 turns on the NMOS transistor 216. Since the NMOS transistor 216 is conducting, the inverted terminal 220 is coupled to the reference potential VSSO, thereby turning on the PMOS transistor 224. With the PMOS transistor 224 turned on, the supply voltage VDD is passed to the non-inverted terminal 204. The supply voltage VDD at the non-inverted terminal 204 corresponds to a logic '1' value. As the output node 212 is coupled to the non-inverted terminal 204, an output signal is provided at the output node 212 having a high voltage state that corresponds to the supply voltage VDD.

During operation, in another implementation, the input signal received at the input node 202 may switch from a high voltage state to a low voltage state, e.g., it may switch from a logic '1' value to a logic '0' value. In this case, the PMOS transistor 222 is turned on, thereby passing the supply voltage VDD to the inverted terminal 220 of the latch circuit 214. The supply voltage VDD at the inverted terminal 220 corresponds to a logic '1' value. The PMOS transistor 224 is turned off and the NMOS transistor 218 is turned on by the logic '1' value at the inverted terminal 210. Since the NMOS transistor 218 is conducting, the non-inverted terminal 204 of the latch circuit 214 is coupled to the reference potential VSSO. The reference potential VSSO at the non-inverted terminal 204 corresponds to a logic '0' value. The low voltage state at the non-inverted terminal 204 turns off the NMOS transistor 216. As the output node 212 is coupled to the non-inverted terminal 204, an output signal is provided at the output node 212 having a low voltage state that corresponds to the reference voltage VSSO.

To summarize, the level shifter circuit 200 may receive an input signal from the VSSI voltage domain and may provide an output signal to a VSSO voltage domain. The voltage level of the low voltage state of the input signal may correspond to the reference potential VSSI that is different than the voltage level of the low voltage state of the output signal that may correspond to the reference potential VSSO. In particular, the level shifter circuit 200 may receive the input signal having a logic '0' value that corresponds to the reference potential VSSI and may provide the output signal having a logic '0' value that corresponds to the reference potential VSSO. The voltage level of the high voltage state of the input signal may correspond to the voltage level of the high voltage state of the output signal, and both may correspond to the supply voltage VDD.

Figure 3:
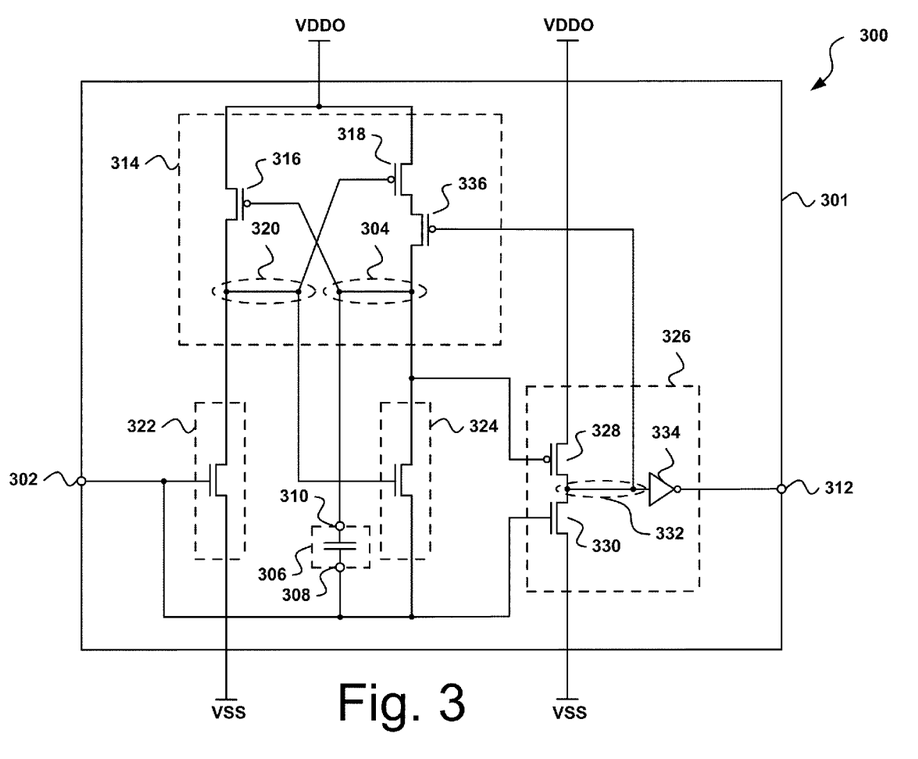
FIG. 3 illustrates a further exemplary level shifter circuit that is implemented in a single well and that includes an output stage.

FIG. 3 illustrates a further exemplary level shifter circuit 300 that is implemented in a single well 301 and that includes an input node 302, an internal node 304 and a capacitor 306. The level shifter circuit 300 includes a first switch device 322 and a second switch device 324 that both may be implemented as NMOS transistors. Furthermore, the level shifter circuit 300 includes a latch circuit 314 that includes an inverted terminal 320 and a non-inverted terminal 304. The non-inverted terminal 304 corresponds to the internal node 304.

The level shifter circuit 300 includes an output stage 326 that is coupled to the latch circuit 314 and to the input node 302. The output stage 326 includes a PMOS transistor 328 coupled in series with an NMOS transistor 330. A source terminal of the PMOS transistor 328 is coupled to a supply voltage VDDO of the level shifter circuit 300, and a source terminal of the NMOS transistor 330 is coupled to a reference potential VSS of the level shifter circuit 300. A drain terminal of the PMOS transistor 328 is coupled to a drain terminal of the NMOS transistor 330, and a node 332 is defined between the drain terminals. The node 332 is coupled to an input of an inverter 334, and an output of the inverter 334 is coupled to an output node 312 of the level shifter circuit 300.

The latch circuit 314 may include two cross-coupled PMOS transistors 316 and 128. The latch circuit 314 further includes a PMOS transistor 336 that is coupled in series with the PMOS transistor 318. The drain terminal of the PMOS transistor 318 is coupled to a source terminal of the PMOS transistor 336, and a drain terminal of the PMOS transistor 336 is coupled to the non-inverted node 304. A gate terminal of the PMOS transistor 336 is coupled to the node 332 of the output stage 326.

In case of a '0'-to-'1' transition of the input signal received at the input node 302, the level shifter circuit 300 will operate as described in connection with FIG. 1. Further, the NMOS transistor 330 of the output stage 330 is turned on, and the node 332 is coupled to the reference potential VSS. The reference potential VSS at the node 332 corresponds to a logic '0' value, and the inverter 334 converts the logic '0' value at its input to a logic '1' value at its output. Therefore, an output signal is provided at the output node 312 having a logic '1' value that corresponds to the supply voltage VDDO. Furthermore, the logic '0' value at the node 332 turns on the PMOS transistor 336 of the latch circuit 314, and the PMOS transistor 328 of the output stage 326 is turned off by the logic '1' value at the non-inverted terminal 304.

In case of a '1'-to-'0' transition of the input signal received at the input node 302, the level shifter circuit 300 will operate as described in connection with FIG. 1. Further, the NMOS transistor 330 of the output stage 330 is turned off, and the bootstrapped logic '0' value at the non-inverted terminal 304 turns on the PMOS transistor 328 of the output stage 326. Since the PMOS transistor 328 is conducting, the node 332 is coupled to the supply voltage VDDO, thereby turning off the PMOS transistor 336. Furthermore, the inverter 334 converts the logic '1' value at its input to a logic '0' value at its output. An output signal is provided at the output node 312 having a logic '0' value that corresponds to the reference voltage VSS.

The size of the PMOS transistor 318 together with the size of the PMOS transistor 336 of the latch circuit 314 of FIG. 3 may be substantially equal to the size of the PMOS transistor 118 of FIG. 1. That is, the size of the PMOS transistor 318 of FIG. 3 may be smaller than the size of the PMOS transistor 118 of FIG. 1. In the case of the '1'-to-'0' transition of the input signal received at the input node 302, the PMOS transistor 318 may be turned off fast. The output signal provided at the output node 312 of the level shifter circuit 300 of FIG. 3 may switch fast from a logic '1' value to a logic '0' value and from a logic '0' value to a logic '1' value.

Figure 4:
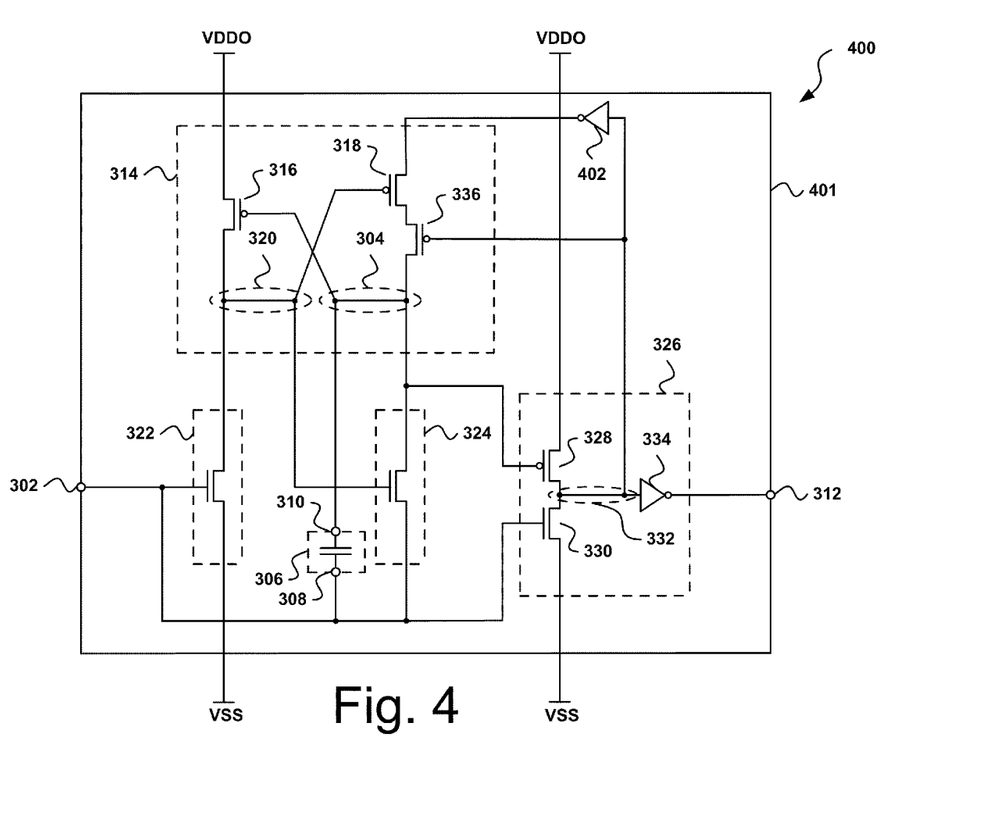
FIG. 4 illustrates a further exemplary level shifter circuit that is implemented in a single well and that includes an inverter.

FIG. 4 illustrates a further exemplary level shifter circuit 400 that is implemented in a single well 401. In addition to the level shifter circuit 300 illustrated and described in FIG. 3, the level shifter circuit 400 includes an inverter 402. An input of the inverter 402 is coupled to the node 332 of the output stage 326, and an output of the inverter 402 is coupled to the source terminal of the PMOS transistor 318. The inverter 402 is operated as a controlled current source and increases the switching speed of the output signal when it switches from a logic '0' value to a logic '1' value.

Figure 5:
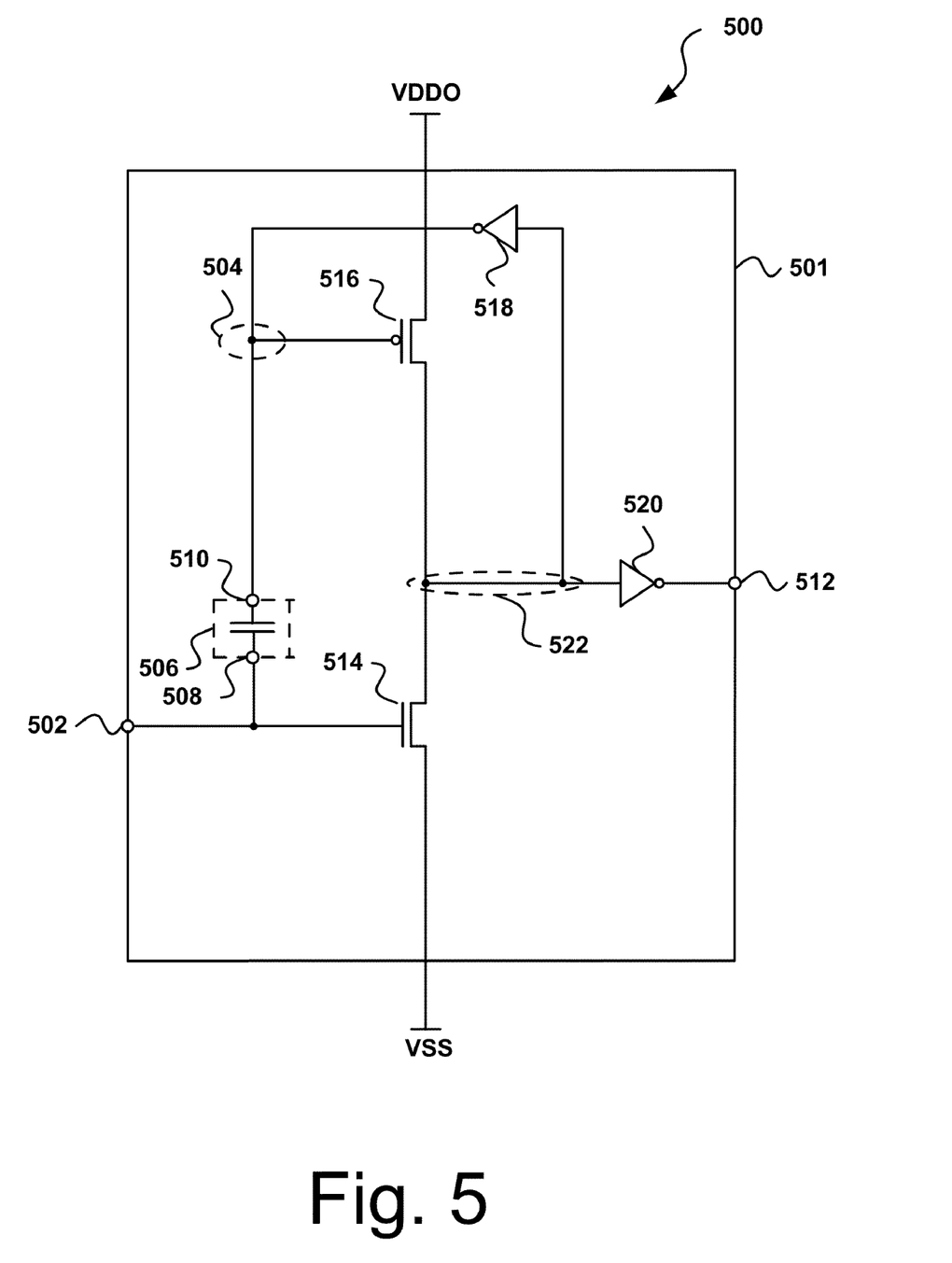
FIG. 5 illustrates a further exemplary level shifter circuit that is implemented in a single well and that includes an NMOS transistor coupled in series with a PMOS transistor.

FIG. 5 illustrates a further exemplary level shifter circuit 500 that is implemented in a single well 501 and that includes an input node 502, an internal node 504 and a capacitor 506. The level shifter circuit 500 further includes an NMOS transistor 514 coupled in series with a PMOS transistor 516. A source terminal of the NMOS transistor 514 is coupled to a reference potential VSS. A source terminal of the PMOS transistor 516 is coupled to a supply voltage VDDO. A drain terminal of the NMOS transistor 514 is coupled to a drain terminal of the PMOS transistor 516, and a node 522 is defined between the drain terminals. The node 522 is coupled to an input of a first inverter 518, and an output of the first inverter 518 is coupled to the internal node 504. The node 522 is further coupled to an input of a second inverter 520, and an output of the second inverter 520 is coupled to an output node 512 of the level shifter circuit 500. A first terminal 508 of the capacitor 506 is coupled to the input node 502 and to a gate terminal of the NMOS transistor 514. A second terminal 510 of the capacitor 506 is coupled to the internal node 504 and to a gate terminal of the PMOS transistor 516. The capacitor 506 may be a bootstrapping capacitor, similar to the capacitor 106, 206 and 306 as illustrated and described in connection with FIGS. 1-4. The first inverter 518 may be implemented as a weak inverter to prevent the internal node 504 from floating during operation of the level shifter circuit 500.

The level shifter circuit 100, 200, 300, 400 and 500 as illustrated and described in connection with FIGS. 1-5 may be included in a standard cell. The standard cell may be used as a building block in a design of an integrated circuit. Furthermore, the standard cell may be part of a standard cell library, and cells of the standard cell library may be compatible with one another, i.e. they may use the same voltage levels, have similar geometries, and the like. The length of the cells of the standard cell library may vary depending on the type and complexity of their function. The height of the cells of the standard cell library may be the same or a multiple of each other. For example, the standard cell including the level shifter circuit 100, 200, 300, 400 and 500 may be twice or three times as high as a standard cell with a least height.

Exemplary System

Figure 6:
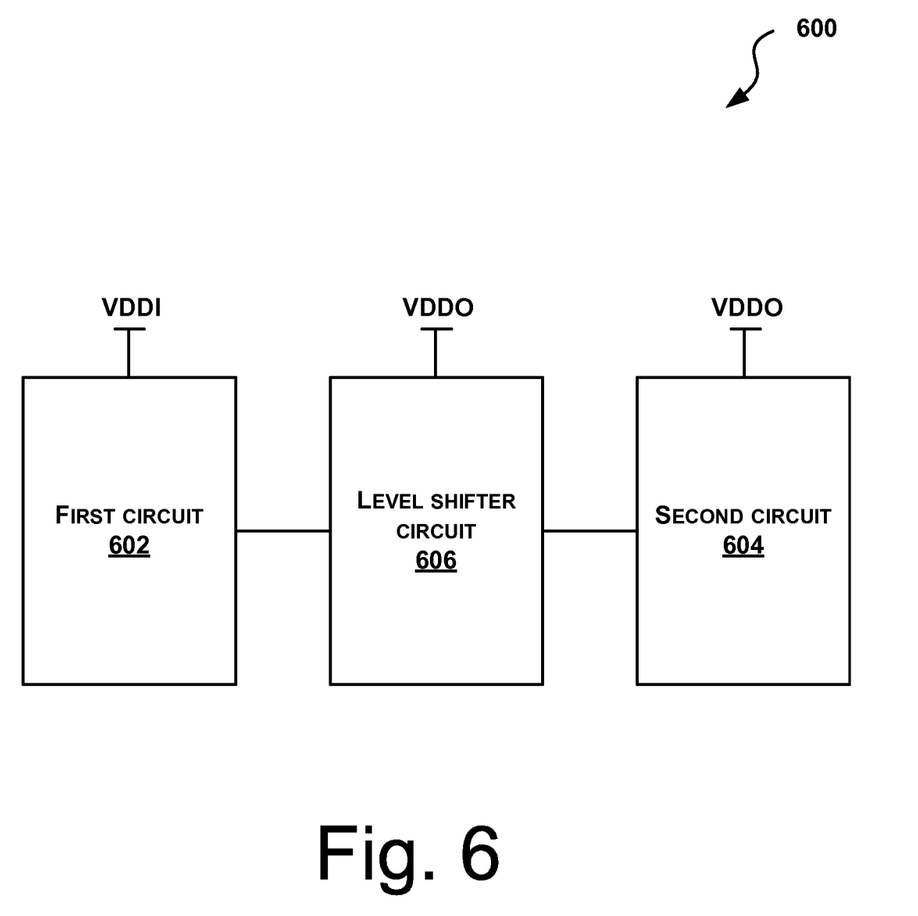
FIG. 6 illustrates an exemplary system having a first circuit, a second circuit and a level shifter circuit.

FIG. 6 illustrates an exemplary system 600 having a first circuit 602, a second circuit 604 and a level shifter circuit 606. The level shifter circuit 606 may be implemented like the level shifter circuit 100, 200, 300, 400 and 500 as illustrated and described in connection with FIGS. 1-5. The first circuit 602 may be included in a first voltage domain and may be supplied by a first supply voltage VDDI. The second circuit 604 may be included in a second voltage domain and may be supplied by a second supply voltage VDDO. The level shifter circuit 606 may receive an input signal from the first circuit 602 and may provide an output signal to the second circuit 604. The level shifter circuit 606 may be coupled to the second supply voltage VDDO and may shift a voltage level of the input signal from the first supply voltage VDDI to the second supply voltage VDDO. The first circuit 602 and the second circuit 604 may be coupled to a same reference potential or to different reference potentials.

In one implementation, the first circuit 602 may be supplied by a first reference potential VSSI, the second circuit 604 may be supplied by a second reference potential VSSO and the level shifter circuit 606 may shift a voltage level of the input signal from the first reference potential VSSI to the second reference potential VSSO. The first circuit 602 and the second circuit 604 may be coupled to a same supply voltage VDD.

The system 600 may be a multi-core processor system, and the processor cores of the system 600 may belong to different voltage domains. The first circuit 602 may include a first processor core that belongs to a first voltage domain, and the first supply voltage VDDI may be a supply voltage of the first voltage domain. The second circuit 604 may include a second processor core that belongs to a second voltage domain, and the second supply voltage VDDO may be a supply voltage of the second voltage domain.

In a further implementation, the system 600 may be a processor system, and blocks of the processor system may belong to different voltage domains. For example, blocks like an ALU, a cache, a memory or a graphical interface may operate at different voltages. One or more level shifter circuits 606 may be included in the processor system to interface the different voltage domains.

In one implementation, the first supply voltage VDDI or the second supply voltage VDDO or both may be dynamically variable. The first circuit 602 or the second circuit 604 may operate at different supply voltage values at different times during operation. For example, the first circuit 602 and the second circuit 604 may employ dynamic voltage scaling to meet variable speed and power requirements.

In one implementation, the first circuit 602, the second circuit 604 and the level shifter circuit 606 may be formed within an integrated circuit device. In another implementation, parts of the system 600 may be formed within one or several separated integrated circuit devices.

Exemplary Method

Figure 7:
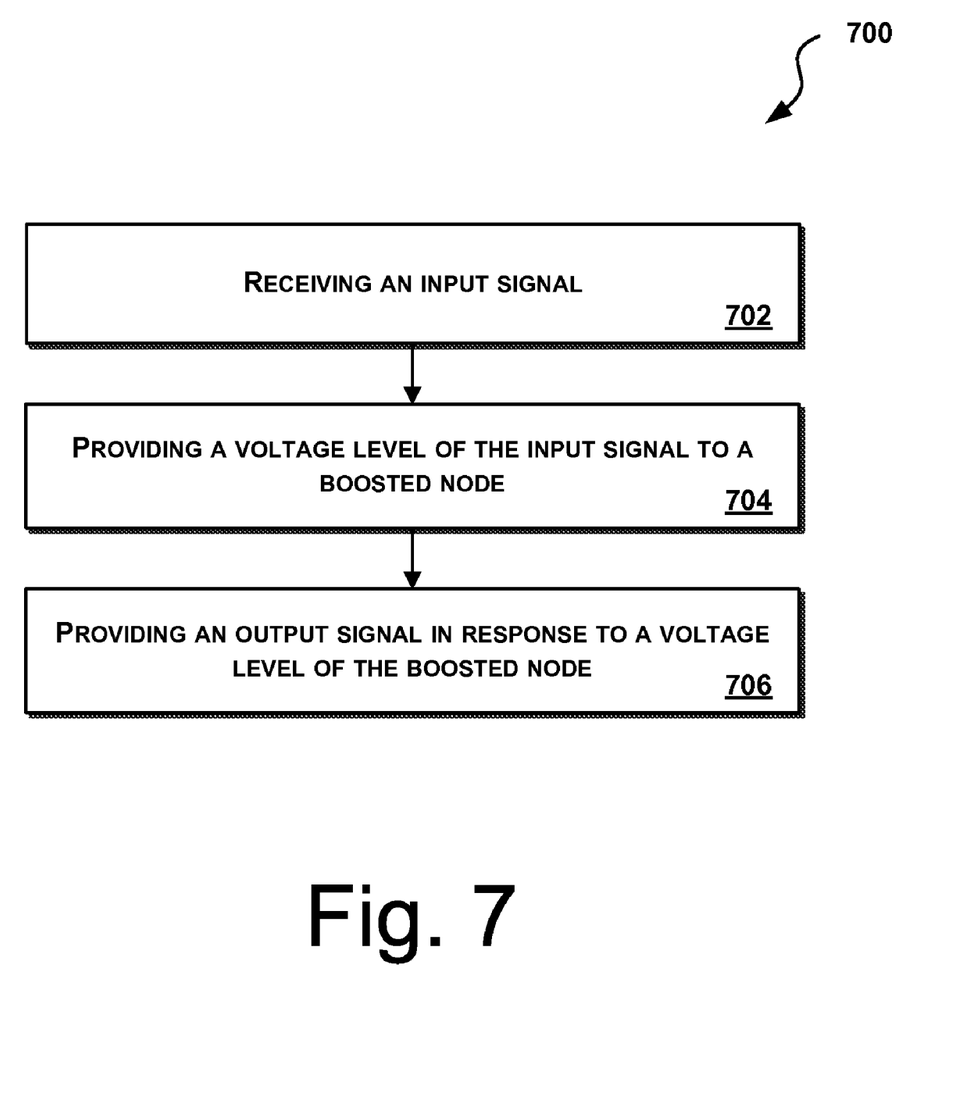
FIG. 7 is a flow chart showing an exemplary method for level shifting in a level shifter circuit.

FIG. 7 is a flow chart showing an exemplary method 700 for level shifting in a level shifter circuit. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIGS. 1-5 and the subject matter thereof. The procedure described in FIG. 7 may be realized utilizing the previously described implementations.

At 702, an input signal is received by the level shifter circuit that is formed in one well. The input signal may be received at the input node 102, 202, 302 and 502 of the level shifter circuit 100, 200, 300, 400 and 500 of FIGS. 1-5.

At 704, a voltage level of the input signal is provided to a boosted node. The boosted node may correspond to the internal node 104, 204, 304 and 504 of FIGS. 1-5. The voltage level of the input signal may be provided to the boosted node by using a capacitor that is coupled between the boosted node and the input node. The capacitor may correspond to the capacitor 106, 206, 306 and 506 of FIGS. 1-5.

At 706, an output signal is provided in response to a voltage level of the boosted node. The output signal may be provided at the output node 112, 212, 312 and 512 of the level shifter circuit 100, 200, 300, 400 and 500 of FIGS. 1-5.

The input signal may have low and high voltage states, and the output signal may have low and high voltage states. A voltage level of the high voltage state of the input signal may correspond to a supply voltage VDDI. A voltage level of the high voltage state of the output signal may correspond to a supply voltage VDDO that may be different than the supply voltage VDDI. Alternatively, a voltage level of the low voltage state of the input signal may correspond to a reference potential VSSI. A voltage level of the low voltage state of the output signal may correspond to a reference potential VSSO that may be different than the reference potential VSSI.

A non-inverted logic state of the input signal may be latched in a non-inverted node, such as the non-inverted terminal 104, 204 and 304 of FIGS. 1-4. An inverted logic state of the input signal may be latched in an inverted node of the level shifter circuit, such as the inverted terminal 120, 220 and 320 of FIGS. 1-4. The latching may be performed in response to a logic state of the input signal.

A reference potential may be switched to the inverted node in response to the logic state of the input signal. The switching may be performed by way of a switch device, such as the first switch device 112, 212 and 312 of FIGS. 1-4. A voltage level at the input node may be switched to the non-inverted node in response to a logic state of the inverted node. The switching may be performed by way of a switch device, such as the second switch device 124, 224 and 324 of FIGS. 1-4.

CONCLUSION

For the purposes of this disclosure and the claims that follow, the term "coupled" has been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims. It is within the scope of this disclosure to combine various features of the different implementations and claims to produce variations thereof.

What is claimed is:

1. A level shifter circuit, comprising:
   an input node configured to receive an input signal;
   an inverted terminal and a non-inverted terminal;
   a capacitor having at least two terminals, wherein at least a first terminal of the at least two terminals is coupled to the input node and at least a second terminal of the at least two terminals is coupled to one of the inverted terminal and the non-inverted terminal;
   a latch circuit coupled to the input node, the latch circuit configured to provide a non-inverted signal at the non-inverted terminal and an inverted signal at the inverted terminal in response to a logic state of the input signal; and
   a first switch device configured to provide a reference potential to the inverted terminal of the latch circuit in response to the logic state of the input signal,
   wherein the level shifter circuit is formed in one well.

2. The level shifter circuit of claim 1, wherein the capacitor is a bootstrapping capacitor configured to provide a voltage level at the input node to the internal node.

3. The level shifter circuit of claim 1, further comprising an output node, the output node configured to provide an output signal having low and high voltage states, and wherein the input node is configured to receive an input signal having low and high voltage states, and further wherein a voltage level of the high voltage state of the output signal is different than a voltage level of the high voltage state of the input signal.

4. The level shifter circuit of claim 3, wherein the voltage level of the high voltage state of the input signal corresponds to a first supply voltage and the voltage level of the high voltage state of the output signal corresponds to a second supply voltage.

5. The level shifter circuit of claim 3, wherein a voltage level of the low voltage state of the output signal and a voltage level of the low voltage state of the input signal correspond to a reference potential.

6. The level shifter circuit of claim 1, wherein the internal node of the level shifter circuit is coupled to the non-inverted terminal of the latch circuit.

7. The level shifter circuit of claim 1, further comprising an output node, wherein the output node is coupled to the inverted terminal or the non-inverted terminal of the latch circuit.

8. The level shifter circuit of claim 1, further comprising an output stage coupled to the latch circuit, wherein the output stage is configured to provide an output signal in response to the logic state of the input signal.

9. The level shifter circuit of claim 1, wherein a voltage level of a high voltage state of the input signal corresponds to a first supply voltage and the latch circuit is coupled to a second supply voltage.

10. The level shifter circuit of claim 1, further comprising a second switch device configured to provide a voltage level at the input node to the non-inverted terminal of the latch circuit in response to a logic state of the inverted terminal of the latch circuit.

11. A method for level shifting in a level shifter circuit, comprising:
    receiving an input signal;
    providing a voltage level of the input signal to a boosted node using a capacitor coupled to one of a non-inverted node or an inverted node;
    providing an output signal in response to a voltage level of the boosted node;
    latching a non-inverted logic state of the input signal in the non-inverted node and latching an inverted logic state of the input signal in the inverted node in response to a logic state of the input signal; and
    switching a reference potential to the inverted node in response to the logic state of the input signal,
    wherein the level shifter circuit is formed in one well.

12. The method of claim 11, wherein the voltage level of the input signal is provided to the boosted node by using the capacitor coupled between the boosted node and an input node configured to receive the input signal.

13. The method of claim 11, wherein a voltage level of a high voltage state of the output signal is different than a voltage level of a high voltage state of the input signal or wherein a voltage level of a low voltage state of the output signal is different than a voltage level of a low voltage state of the input signal.

14. The method of claim 11, further comprising switching a voltage level at the input node to the non-inverted node in response to a logic state of the inverted node.

* * * * *